US012765180B2

(12) United States Patent
Wu et al.

(10) Patent No.: US 12,765,180 B2
(45) Date of Patent: Oct. 13, 2026

(54) BACKBOARD STRUCTURE, MANUFACTURING METHOD THEREOF, AND DISPLAY DEVICE

(71) Applicant: Shenzhen China Star Optoelectronics Semiconductor Display Technology Co., Ltd., Shenzhen (CN)

(72) Inventors: Fanjing Wu, Shenzhen (CN); Jingyuan Hu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 357 days.

(21) Appl. No.: 18/401,330

(22) Filed: Dec. 29, 2023

(65) Prior Publication Data

US 2025/0017078 A1 Jan. 9, 2025

(30) Foreign Application Priority Data

Jul. 6, 2023 (CN) ......................... 202310828141.1

(51) Int. Cl.

| | |
|---|---|
| ***H10K 59/122*** | (2023.01) |
| ***H10K 59/12*** | (2023.01) |
| ***H10K 59/124*** | (2023.01) |
| ***H10K 59/80*** | (2023.01) |

(52) U.S. Cl.

CPC ....... *H10K 59/122* (2023.02); *H10K 59/1201* (2023.02); *H10K 59/124* (2023.02); *H10K 59/80522* (2023.02)

(58) Field of Classification Search

CPC ......... H10K 59/80522; H10K 59/1201; H10K 59/122; H10K 59/131; H10K 59/8052; H10K 59/124

See application file for complete search history.

(56) References Cited

U.S. PATENT DOCUMENTS

2022/0246649 A1* 8/2022 Liang ..................... H10K 71/00
2024/0237459 A1* 7/2024 Jang ..................... H10K 50/824
2024/0357872 A1* 10/2024 Hwang .............. H10K 59/8731
2024/0381697 A1* 11/2024 Yang .................... H10K 59/122

* cited by examiner

*Primary Examiner* — Eduardo A Rodela
(74) *Attorney, Agent, or Firm* — PV IP PC; Christopher Ruprecht; Wei Te Chung

(57) ABSTRACT

A backboard structure includes an array substrate, a passivation layer, a planarization layer, a padding portion, a pixel definition layer, and a cathode layer. The passivation layer is formed on the array substrate and covering an auxiliary electrode layer on the array substrate. A hole is formed through the passivation layer at a position corresponding to the auxiliary electrode layer. The padding portion is formed on an inner wall of the hole and covering a portion of the auxiliary electrode layer. The pixel definition layer is formed on the planarization layer and includes an extension section covering the inner wall of the hole. The extension section surrounds to form an overlapping hole, and extends towards the padding portion to form a drilling structure. A continuous overlap section of the cathode layer is overlapped with the auxiliary electrode layer through the overlapping hole and the drilling structure.

14 Claims, 3 Drawing Sheets

BACKBOARD STRUCTURE, MANUFACTURING METHOD THEREOF, AND DISPLAY DEVICE

CROSS REFERENCE TO RELATED APPLICATION

This application claims priority to Chinese Application No. 202310828141.1, filed on Jul. 6, 2023. The entire disclosures of the above applications are incorporated herein by reference.

FIELD OF THE INVENTION

The present disclosure relates to the field of organic light-emitting diode (OLED) display technology, more particularly, to a backboard structure, a manufacturing method thereof, and a display device.

BACKGROUND

With the development of display technology, the use of large-sized display devices is becoming increasingly widespread. Taking top-emitting large-sized OLEDs as an example, the display panel structure of top-emitting large-sized OLEDs comprises a transparent anode layer, a luminescent layer, and a metal cathode layer. In order to increase the transmittance of top emission, the thickness of the metal cathode is designed to be thinner. At the same time, an auxiliary electrode is installed and connected to a thinner metal cathode. Due to the small resistance of the auxiliary electrode, the current drop is reduced. Therefore, when powered on, the impedance and current drop of the cathode of the panel are reduced. While ensuring an increase in the transmittance of the top emission, the current drop (IR drop) problem is improved, resulting in a certain improvement in the brightness uniformity of the panel. In existing technology, there are two ways to achieve the overlap between the auxiliary electrode and the metal cathode. One is to set an inverted trapezoidal isolation column between the cathode and the auxiliary electrode. However, the large volume proportion of the isolation column will affect the opening rate and packaging. Moreover, due to the limited selectivity of the isolation column's raw materials, the production process becomes complex, thereby reducing production efficiency. Another approach is to use a planarization layer (PLA) or M3 undercoat to create an Undercut structure (drilling structure), which can also create an overlap area between the cathode and the auxiliary electrode, thereby improving the issue of IR Drop. However, this solution generally requires the addition of a new mask, which undoubtedly increases investment costs.

SUMMARY

An embodiment of the present disclosure is directed to a backboard structure and a manufacturing method thereof, and a display device, which can not only simplify the production process and improve production efficiency, but also reduce production costs without adding a light mask, while improving the IR drop problem.

According an embodiment of the present disclosure, a backboard structure includes an array substrate, a passivation layer, a planarization layer, a padding portion, a pixel definition layer, and a cathode layer. On the array substrate is formed an auxiliary electrode layer. The passivation layer is formed on the array substrate and covering the auxiliary electrode layer. The planarization layer is formed on the side of the passivation layer away from the array substrate, and a hole is formed through the passivation layer at a position corresponding to the auxiliary electrode layer. The padding portion is formed on an inner wall of the hole and covering a portion of the auxiliary electrode layer. The pixel definition layer is formed on the side of the planarization layer away from the passivation layer. The pixel definition layer includes an extension section for covering the inner wall of the hole. The extension section surrounding to form an overlapping hole, and one end of the extension section extending towards the padding portion. A drilling structure is formed at an end of the extension section. The cathode layer is formed on one side of the pixel definition layer away from the planarization layer, and has a continuous overlap section that is overlapped with the auxiliary electrode layer through the overlapping hole and the drilling structure.

Optionally, the inner wall of the hole protrudes towards the middle of the hole at the position corresponding to the passivation layer to form a first annular pad layer, and the first annular pad layer covering a portion of the auxiliary electrode layer. The padding portion includes the first annular pad layer.

Optionally, the inner wall of the hole is ringed with a first anode pad upper layer at a position corresponding to the planarization layer, and the first anode pad upper layer is located on the side of the first annular pad layer away from the auxiliary electrode layer. The first anode pad upper layer has a covering section, which extends to the inner wall of the first annular pad layer. The padding portion further includes the first anode pad upper layer. The continuous overlap section of the cathode layer overlaps with the first anode pad upper layer.

Optionally, the inner wall of the hole is ringed with a second anode pad upper layer at a position corresponding to the passivation layer, and the second anode pad upper layer covers a portion of the auxiliary electrode layer. The padding portion includes the second anode pad upper layer. The continuous overlap section of the cathode layer overlaps with the second anode pad upper layer.

Optionally, the backboard structure further includes an organic functional layer including a first segment and a second segment separated from the first segment. The first segment is formed between the pixel definition layer and the cathode layer, and a portion of the first segment extends along the inner wall of the overlapping hole to the drilling structure and envelops the inner wall of the overlapping hole, and the second segment is located within the hole and covers the auxiliary electrode layer.

According another embodiment of the present disclosure, a method for manufacturing a backboard structure includes: providing an array of substrates; patterning a passivation layer deposited on one side of the array substrate with yellow light and etching processes; patterning a planarization layer formed on the side of the passivation layer away from the array substrate; forming holes through the passivation layer at the auxiliary electrode layer corresponding to the array substrate on the planarization layer, and forming a padding portion on the inner wall of the holes; depositing an anode layer on the side of the planarization layer away from the passivation layer, and defining an anode pattern using yellow light, wherein the anode layer corresponds to the pixel electrode area setting; forming a pixel definition layer covering the anode layer on the side of the planarization layer away from the passivation layer, wherein an extension section of the pixel definition layer covers the inner wall of the hole to enclose and form an overlapping hole; exposing and developing the pixel definition layer to form a drilling structure on the inner wall of the overlapping hole and near the padding portion; forming an organic functional layer on the side of the pixel definition layer away from the planarization layer; and forming a cathode layer on the side of the organic functional layer away from the pixel definition layer, wherein the cathode layer has a continuous overlap section, which is overlapped with the auxiliary electrode layer of the array substrate through the overlapping hole and the drilling structure.

Optionally, the forming holes through the passivation layer at the auxiliary electrode layer corresponding to the array substrate on the planarization layer, and forming a padding portion on the inner wall of the holes, includes: forming a first through-hole on the passivation layer, wherein the first through-hole corresponds to the auxiliary electrode layer of the array substrate; and forming a second through-hole at the auxiliary electrode layer corresponding to the array substrate on the planarization layer, wherein the second through-hole is connected to the first through-hole to form the hole, and an aperture of the second through-hole is larger than an aperture of the first through-hole, so that the passivation layer at the edge of the first through-hole forms a first annular pad layer to form the padding portion.

Optionally, after the forming a second through-hole at the auxiliary electrode layer corresponding to the array substrate on the planarization layer, the method further includes: depositing a first anode pad upper layer at the auxiliary electrode layer corresponding to the array substrate, and defining a first anode pad upper layer pattern using yellow light, wherein the first anode pad upper layer is located on the side of the first annular pad layer away from the auxiliary electrode layer to jointly form the padding portion, and the first anode pad upper layer has a coverage section to extend to the inner wall of the first annular pad layer.

Optionally, the forming holes through the passivation layer at the auxiliary electrode layer corresponding to the array substrate on the planarization layer, and forming a padding portion on the inner wall of the holes, includes: forming holes through the passivation layer at the auxiliary electrode layer corresponding to the array substrate on the planarization layer; and depositing a second anode pad upper layer at the auxiliary electrode layer corresponding to the array substrate, and defining a second anode pad upper layer pattern using yellow light to form the padding portion, wherein the second anode pad upper layer is ringed on the inner wall of the hole and covers a portion of the auxiliary electrode layer.

According still another embodiment of the present disclosure, a display device comprises a backboard structure. The backboard structure backboard structure includes an array substrate, a passivation layer, a planarization layer, a padding portion, a pixel definition layer, and a cathode layer. On the array substrate is formed an auxiliary electrode layer. The passivation layer is formed on the array substrate and covering the auxiliary electrode layer. The planarization layer is formed on the side of the passivation layer away from the array substrate, and a hole is formed through the passivation layer at a position corresponding to the auxiliary electrode layer. The padding portion is formed on an inner wall of the hole and covering a portion of the auxiliary electrode layer. The pixel definition layer is formed on the side of the planarization layer away from the passivation layer. The pixel definition layer includes an extension section for covering the inner wall of the hole. The extension section surrounding to form an overlapping hole, and one end of the extension section extending towards the padding portion, and forming a drilling structure. The cathode layer is formed on one side of the pixel definition layer away from the planarization layer, and has a continuous overlap section that is overlapped with the auxiliary electrode layer through the overlapping hole and the drilling structure.

Optionally, the inner wall of the hole protrudes towards the middle of the hole at the position corresponding to the passivation layer to form a first annular pad layer, and the first annular pad layer covering a portion of the auxiliary electrode layer. The padding portion includes the first annular pad layer.

Optionally, the inner wall of the hole is ringed with a first anode pad upper layer at a position corresponding to the planarization layer, and the first anode pad upper layer is located on the side of the first annular pad layer away from the auxiliary electrode layer. The first anode pad upper layer has a covering section, which extends to the inner wall of the first annular pad layer. The padding portion further includes the first anode pad upper layer. The continuous overlap section of the cathode layer overlaps with the first anode pad upper layer.

Optionally, the inner wall of the hole is ringed with a second anode pad upper layer at a position corresponding to the passivation layer, and the second anode pad upper layer covers a portion of the auxiliary electrode layer. The padding portion includes the second anode pad upper layer. The continuous overlap section of the cathode layer overlaps with the second anode pad upper layer.

Optionally, the backboard structure further includes an organic functional layer including a first segment and a second segment separated from the first segment. The first segment is formed between the pixel definition layer and the cathode layer, and a portion of the first segment extends along the inner wall of the overlapping hole to the drilling structure and envelops the inner wall of the overlapping hole, and the second segment is located within the hole and covers the auxiliary electrode layer.

The backboard structure provided in the present embodiment comprises an array substrate, a passivation layer, a planarization layer, a padding portion, a pixel definition layer, and a cathode layer. The planarization layer forms holes that penetrate the passivation layer at the corresponding positions of the auxiliary electrode layer. The padding portion is formed on the inner wall of the hole and covers a portion of the auxiliary electrode layer. The extension section of the pixel definition layer wraps around the inner wall of the hole to form an overlapping hole, and one end of the extension section extends to the padding portion. A drilling structure is formed at an end of the extension section. The continuous overlap section of the cathode layer is overlapped with the auxiliary electrode layer through the overlapping hole and the drilling structure. The planarization layer forms a hole at the position corresponding to the auxiliary electrode layer, and an extension section of the pixel definition layer wraps around the inner wall of the hole to form an overlapping hole. When exposing the pixel definition layer, the extension section extends to one end of the padding portion and cannot receive sufficient UV light irradiation denaturation. When developing the pixel definition layer, one end of the extension section is washed off by the developing solution, Thus, a drilling structure is formed at one end of the extension section near the padding portion, and the continuous overlap section of the cathode layer is overlapped with the auxiliary electrode layer through the overlapping hole and the drilling structure. In this way, the overlap between the cathode layer and the auxiliary electrode layer can be achieved, thereby improving the IR drop problem. Moreover, the present application not only simplifies the production process and improves production efficiency, but also utilizes the photosensitive characteristics of the pixel definition layer to form the drilling structure on the pixel definition layer without the need for an additional mask. At the same time, the height of the drilling structure can be reduced by setting the padding portion, making it easier for the cathode layer to climb along the padding portion to form the continuous overlap section, and making it easier for the continuous overlap section to overlap with the auxiliary electrode layer through the overlapping hole and the drilling structure, further ensuring the improvement effect of the IR drop problem.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF THE EMBODIMENTS

Figure 1:
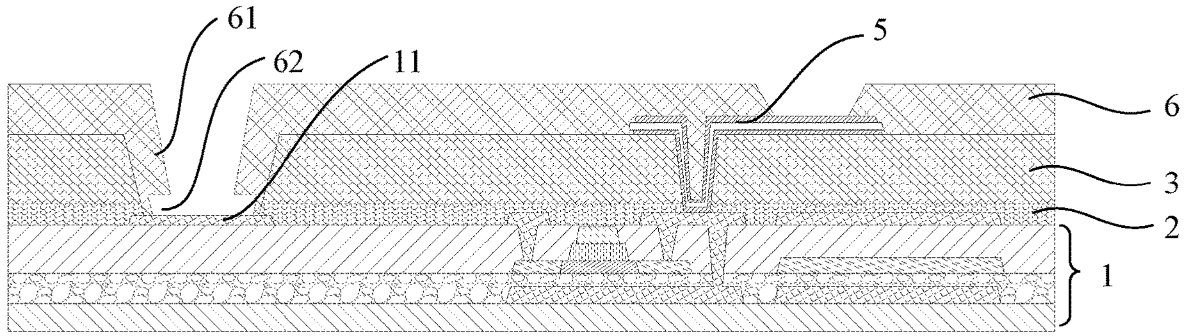
FIG. 1 is a schematic diagram of a principle structure of a backboard structure according to one embodiment of the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary and are intended to illustrate and interpret the present disclosure, which shall not be construed as causing limitations to the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Please refer to FIGS. 1 to 5. The present embodiment provides a backboard structure 100, which can be a backboard structure 100 for smartphones, tablets, display screens, etc. The backboard structure 100 comprises an array substrate 1, a passivation layer 2, a planarization layer 3, a padding portion 4, a pixel definition layer 6, and a cathode layer 7. An auxiliary electrode layer 11 is formed on the array substrate 1. The passivation layer 2 is formed on one side of the array substrate 1 and covers the auxiliary electrode layer 11. The planarization layer 3 is formed on the side of the passivation layer 2 away from the array substrate 1. The planarization layer 3 forms a hole that runs through the passivation layer 2 at the corresponding position of the auxiliary electrode layer 11. The padding portion 4 is formed on the inner wall of the hole and covers a portion of the auxiliary electrode layer 11. The pixel definition layer 6 is formed on the side of the planarization layer 3 away from the passivation layer 2. The pixel definition layer 6 has an extension section 61 useful for covering the inner wall of the hole, which is enclosed to form an overlapping hole. One end of the extension section 61 extends to the padding portion 4 and forms a drilling structure 62. The cathode layer 7 is formed on one side of the pixel definition layer 6 away from the planarization layer 3. The cathode layer 7 has a continuous overlap section 71, which is overlapped with the auxiliary electrode layer 11 through the overlapping hole and the drilling structure 62.

Embodiments of the present disclosure does not limit the specific form of the padding portion 4, as long as it can reduce the height of the drilling structure 62, so that the cathode layer 7 can more easily climb along the padding portion 4 to form the continuous overlap section 71.

Figure 2:
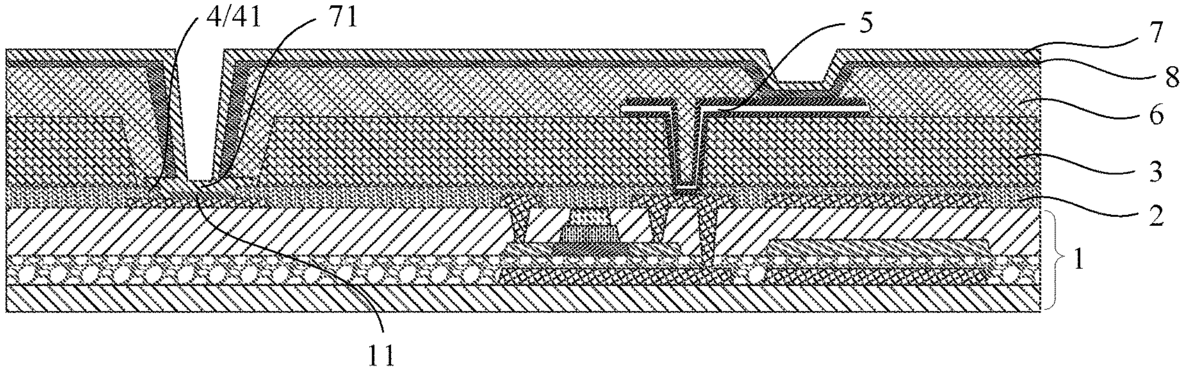
FIG. 2 is a schematic diagram of the backboard structure according to the first embodiment of the present disclosure.

Please refer to FIG. 2, where the inner wall of the hole protrudes towards the middle of the hole at the position corresponding to the passivation layer 2 to form a first annular pad layer 41, which covers a portion of the auxiliary electrode layer 11. The padding portion 4 comprises the first annular pad layer 41. That is to say, the padding portion 4 is formed by the protrusion and extension of the passivation layer 2, forming the first annular pad layer 41. The extension section 61 of the pixel definition layer 6 extends to the first annular pad layer 41, and the auxiliary electrode layer 11 is partially covered by the first annular pad layer 41. When exposing the pixel definition layer 6, the extension section 61 cannot receive sufficient UV light irradiation denaturation at one end of the first annular pad layer 41. When developing the pixel definition layer 6, this position is washed away by the developer, forming a drilling structure 62 at the end of the extension section 61 near the first annular pad layer 41. Due to the formation of the first annular pad layer 41 on the passivation layer 2, the height of the drilling structure 62 can be reduced. Therefore, when depositing the cathode layer 7, it is easier for the cathode layer 7 to be continuous within the overlapping hole, and the continuous overlap section 71 of the cathode layer 7 is overlapped with the exposed auxiliary electrode layer 11 through the overlapping hole and the drilling structure 62. In this way, the overlap between the cathode layer 7 and the auxiliary electrode layer 11 can be achieved, thereby improving the IR drop problem.

Figure 3:
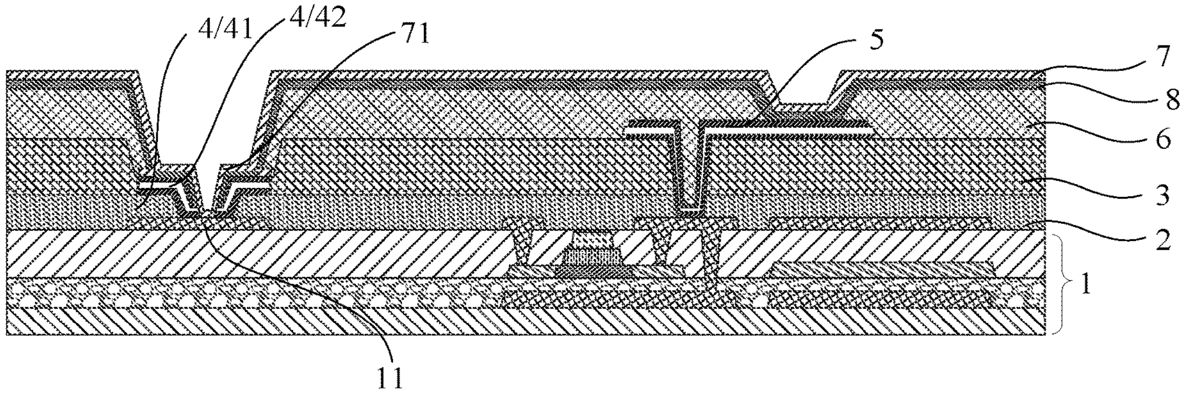
FIG. 3 is a schematic diagram of the backboard structure according to the second embodiment of the present disclosure.
Figure 4:
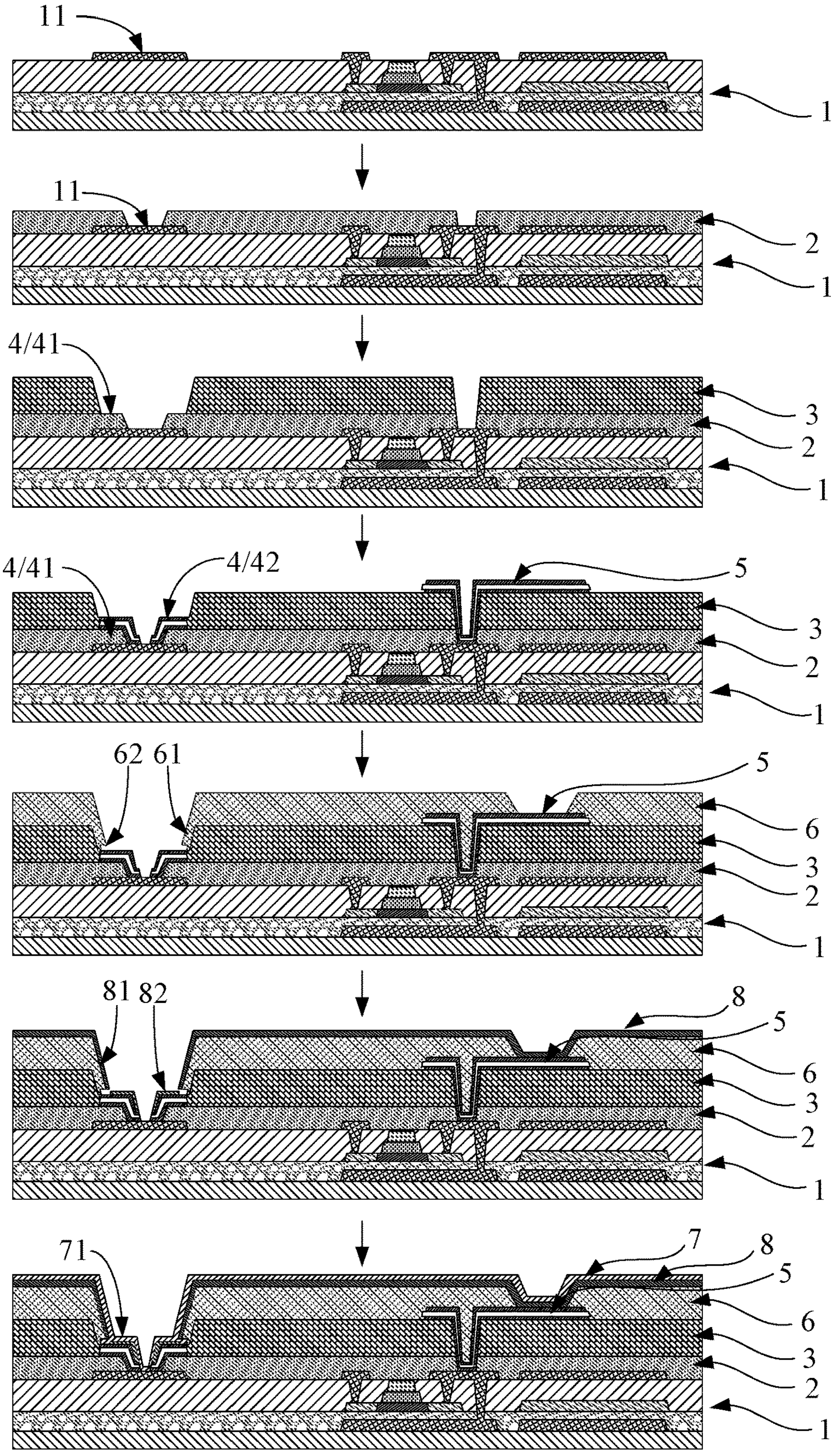
FIG. 4 is a production process diagram of the backboard structure according to the second embodiment of the present disclosure.

Please refer to FIGS. 3 and 4. The inner wall of the hole is ringed with a first anode pad upper layer 42 at the position corresponding to the planarization layer 3. The first anode pad upper layer 42 is located on the side of the first annular pad layer 41 away from the auxiliary electrode layer 11. The first anode pad upper layer 42 has a covering section, which extends to the inner wall of the first annular pad layer 41. The padding portion 4 also comprises the first anode pad upper layer 42. The continuous overlap section 71 of cathode layer 7 overlaps with the first anode pad high-level 42. That is to say, the passivation layer 2 protrudes and extends to form the first annular pad layer 41, which covers a portion of the auxiliary electrode layer 11. When depositing an anode layer 5 on the side of the planarization layer 3 away from the passivation layer 2, a first anode pad upper layer 42 is also deposited in the hole. The first anode pad upper layer 42 is ringed on the inner wall of the hole and is located at the corresponding position of the planarization layer 3. The first anode pad upper layer 42 is located on the side of the first annular pad layer 41 away from the auxiliary electrode layer 11. The first anode pad upper layer 42 has a covering section, which is extended to the inner wall of the first annular pad layer 41. The extension segment 61 of pixel definition layer 6 extends to the first anode pad upper layer 42. When exposing pixel definition layer 6, the end of the extension segment 61 extending to the first anode pad upper layer 42 cannot receive sufficient UV light irradiation denaturation. When developing pixel definition layer 6, this position is washed away by the developer, forming a drilling structure 62 at the end of the extension segment 61 near the first anode pad upper layer 42. Due to the formation of the first annular pad layer 41 on the passivation layer 2, the first anode pad upper layer 42 is formed on the first annular pad layer 41, which can further reduce the height of the drilling structure 62. Therefore, when depositing the cathode layer 7, the cathode layer 7 is made more in the overlapping hole. It is easy to be continuous, and the continuous overlap section 71 of the cathode layer 7 is overlapped with the edge of the exposed auxiliary electrode layer 11 and the first anode pad upper layer 42 through the overlapping hole and the drilling structure 62. In this way, the overlap between the cathode layer 7 and the auxiliary electrode layer 11 can be achieved, thereby improving the IR drop problem.

Figure 5:
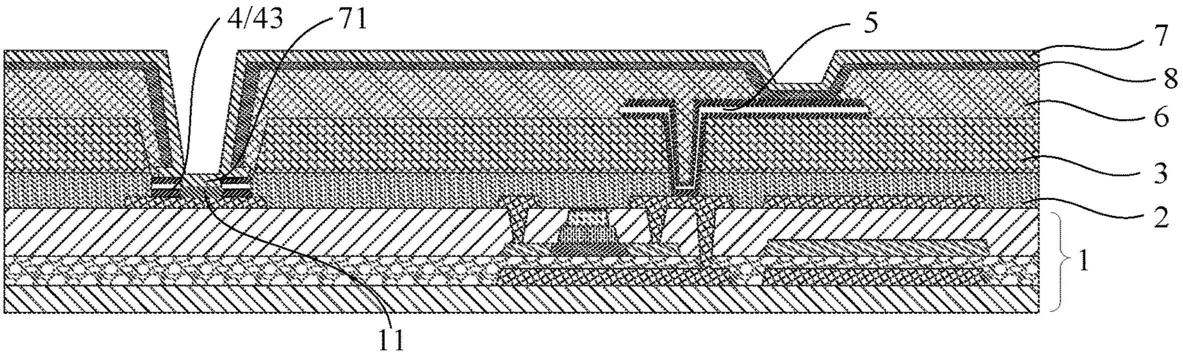
FIG. 5 is a schematic diagram of the backboard structure according to the third embodiment of the present disclosure.

Please refer to FIG. 5, where the inner wall of the hole is ringed with a second anode pad upper layer 43 at the position corresponding to the passivation layer 2, and the second anode pad upper layer 43 covers a portion of the auxiliary electrode layer 11. The padding portion 4 comprises the second anode pad upper layer 43. The continuous overlap section 71 of cathode layer 7 overlaps with the second anode pad upper layer 43. In this embodiment, the planarization layer 3 forms a hole that runs through the passivation layer 2 at the position corresponding to the auxiliary electrode layer 11. When the anode layer 5 is deposited on the side of the planarization layer 3 away from the passivation layer 2, a second anode pad upper layer 43 is deposited in the hole. The second anode pad upper layer 43 is placed on the inner wall of the hole and is located at the position corresponding to the planarization layer 3, and the auxiliary electrode layer 11 is partially covered by the second anode pad upper layer 43. The extension segment 61 of pixel definition layer 6 extends to the second anode pad upper layer 43. When exposing the pixel definition layer 6, the end of the extension segment 61 extending to the second anode pad upper layer 43 cannot receive sufficient UV light irradiation denaturation. When developing the pixel definition layer 6, this position is washed away by the developer, forming a drilling structure 62 at the end of the extension segment 61 near the second anode pad upper layer 43, The inner wall ring of the hole is equipped with a second anode pad upper layer 43, which can reduce the height of the drilling structure 62. Therefore, when depositing the cathode layer 7, it is easier for the cathode layer 7 to be continuous in the overlapping hole. The continuous overlap section 71 of the cathode layer 7 is overlapped with the exposed auxiliary electrode layer 11 and the edge of the second anode pad upper layer 43 through the overlapping hole and the drilling structure 62, It is possible to achieve overlap between the cathode layer 7 and the auxiliary electrode layer 11, thereby improving the IR drop problem.

In an embodiment, the backboard structure 100 further comprises an organic functional layer 8, which comprises at least a first segment 81 and a second segment 82 that are mutually disconnected. The first segment 81 is formed between the pixel definition layer 6 and the cathode layer 7, and a portion of the first segment 81 extends along the inner wall of the overlapping hole to the drilling structure 62 and covers the inner wall of the overlapping hole. The second segment 82 is located within the hole and covers the auxiliary electrode layer 11.

The planarization layer 3 forms the hole at the position corresponding to the auxiliary electrode layer 11. The extension section 61 of the pixel definition layer 6 wraps around the inner wall of the hole to form an overlapping hole. When exposing the pixel definition layer 6, the end of the extension section 61 extending to the padding portion 4 cannot receive sufficient UV light irradiation denaturation. When developing the pixel definition layer 6, one end of the extension section 61 is washed away by the developing solution, Thus, a drilling structure 62 is formed at one end of the extension section 61 near the padding portion 4, and the continuous overlap section 71 of the cathode layer 7 is overlapped with the auxiliary electrode layer 11 through the overlapping hole and the drilling structure 62. In this way, the overlap between the cathode layer 7 and the auxiliary electrode layer 11 can be achieved, thereby improving the IR drop problem. Moreover, the solution of this embodiment of the present disclosure not only simplifies the production process and improves production efficiency, but also forms a drilling structure 62 on the pixel definition layer 6 through the photosensitive characteristics of the pixel definition layer 6, without the need for an additional mask. The simultaneously set padding portion 4 can reduce the height of the drilling structure 62, making it easier for the cathode layer 7 to climb along the padding portion 4 to form the continuous overlap section 71, and making it easier for the continuous overlap section 71 to overlap with the auxiliary electrode layer 11 through the overlapping hole and the drilling structure 62, further ensuring the improvement effect of the IR drop problem.

One embodiment of the present disclosure is also directed to a method for making a backboard structure 100, which comprises steps S10-S90.

S10: providing an array of substrate 1.

S20: depositing a passivation layer 2 on one side of the array substrate 1 and subjected to yellow light and etching patterning.

S30: forming a planarization layer 3 on the side of the passivation layer 2 away from the array substrate 1 and patterning it.

S40: forming a hole at the auxiliary electrode layer 11 corresponding to the array substrate 1 on the planarization layer 3, which runs through the passivation layer 2, and a padding portion 4 is formed on the inner wall of the hole.

S50: forming an anode layer 5 by depositing on the side of the planarization layer 3 away from the passivation layer 2, and defining the anode pattern using yellow light, where the anode layer 5 corresponds to the pixel electrode area setting.

S60: covering the anode layer 5 by a pixel definition layer 6, which is made on the side of the planarization layer 3 away from the passivation layer 2, and covering the inner wall of the hole by an extension section 61 of the pixel definition layer 6 to enclose and form an overlapping hole.

S70: exposing and developing the pixel definition layer 6 to form a drilling structure 62 on the inner wall of the overlapping hole and near the padding portion 4.

S80: forming an organic functional layer 8 on the side of the pixel definition layer 6 away from the planarization layer 3.

S90: creating a cathode layer 7 on the side of the organic functional layer 8 that is away from the pixel definition layer 6, and the cathode layer 7 has a continuous overlap section 71, which is overlapped with the auxiliary electrode layer 11 of the array substrate 1 through the overlapping hole and the drilling structure 62.

Specifically, SiOx or SiNx or multi-layer structural thin films are deposited on one side of the array substrate 1 to form a passivation layer 2. On the side of the planarization layer 3 away from the passivation layer 2, use physical vapor deposition (PVD) to sequentially deposit TCO/Ag/TCO to form the anode layer 5. On the side of the organic functional layer 8 away from the pixel definition layer 6, the cathode layer 7 is deposited by sputtering.

In one embodiment, a hole is formed at the auxiliary electrode layer 11 corresponding to the array substrate 1 on the planarization layer 3, which penetrates through the passivation layer 2, and a padding portion 4 is formed on the inner wall of the hole. In this embodiment, the step S40 includes steps S401 and S402.

S401: forming a first through-hole is on the passivation layer 2, the first through-hole corresponds to the auxiliary electrode layer 11 of the array substrate 1.

S402: forming a second through-hole at the auxiliary electrode layer 11 corresponding to the array substrate 1 on the planarization layer 3, and the second through-hole is connected to the first through-hole to form the hole. The aperture of the second through-hole is larger than that of the first through-hole, so that the passivation layer 2 at the periphery of the first through-hole forms a first annular pad layer 41 to form a padding portion 4.

In one embodiment, a second through-hole is formed at the auxiliary electrode layer 11 corresponding to the array substrate 1 on the planarization layer 3, and the second through-hole is connected to the first through-hole to form the hole. After step S402, step S403 is also included.

S403: depositing a first anode pad upper layer 42 at the auxiliary electrode layer 11 corresponding to the array substrate 1, and defining the shape of the first anode pad upper layer 42 using yellow light. The first anode pad upper layer 42 is located on the side of the first annular pad layer 41 away from the auxiliary electrode layer 11 to jointly form the padding portion 4. The first anode pad upper layer 42 has a coverage section to extend to the inner wall of the first annular pad layer 41.

In one embodiment, a hole is formed at the auxiliary electrode layer 11 corresponding to the array substrate 1 on the planarization layer 3, which penetrates through the passivation layer 2, and a padding portion 4 is formed on the inner wall of the hole. In this embodiment, the step S40 includes steps S401' and S402'.

S401': forming a hole through the passivation layer 2 at the auxiliary electrode layer 11 corresponding to the array substrate 1 on the planarization layer 3.

S402': depositing a second anode pad upper layer 43 at the auxiliary electrode layer 11 corresponding to the array substrate 1, and defining the shape of the second anode pad upper layer 43 using yellow light to form a padding portion 4. The second anode pad upper layer 43 is placed on the inner wall of the hole and covers a portion of the auxiliary electrode layer 11.

In one embodiment, step S10 of providing an array substrate 1 comprises the following steps.

S101: providing a glass substrate.

S102: forming a metal shading layer is by depositing on one side of the glass substrate.

S103: depositing a buffer layer is on one side of the glass substrate, the buffer layer covers the metal shading layer.

S104: depositing a semiconductor layer on the side of the buffer layer away from the glass substrate, and the pattern is etched.

S105: depositing a gate insulation layer on the side of the semiconductor layer away from the buffer layer.

S106: depositing a gate metal layer on the side of the gate insulation layer away from the semiconductor layer.

S107: using yellow light to etch the corresponding pattern of the gate metal layer, and use the pattern of the gate metal layer as self-alignment to etch the corresponding pattern of the gate insulation layer.

S108: forming a conductive region by using plasma etching at the area on the semiconductor layer that is not covered by the gate insulation layer and the gate metal layer. The area on the semiconductor layer that is covered by the gate insulation layer and the gate metal layer maintains semiconductor characteristics, forming TFT channels.

S109: depositing an interlayer insulation layer on the side of the buffer layer away from the glass substrate, the interlayer insulation layer covers the semiconductor layer, the gate insulation layer, and the gate metal layer.

S110: using yellow light, define the first contact hole on the buffer layer and etch the first contact hole.

S120: using yellow light, define the second contact hole on the interlayer insulation layer and etch the second contact hole.

S130: depositing a source drain metal layer and an auxiliary electrode layer 11 on the side of the interlayer insulation layer away from the buffer layer, and patterned using yellow light and etching.

Specifically, before depositing the metal shading layer, the glass substrate needs to be cleaned. The material of the metal shading layer can be Mo, Ti, Cu, Mn, etc., or an alloy. Depositing a layer of SiOx, SiNx, or multi-layer structural thin film on one side of the glass substrate to form the buffer layer. Depositing a layer of metal oxide semiconductor material (Oxide) on the side of the buffer layer away from the glass substrate to form the semiconductor layer, which can be IGZO, IZTO, IGZTO, etc. Depositing a layer of SiOx, SiNx, or multi-layer structural thin film on the side of the semiconductor layer away from the buffer layer to form the gate insulation layer. Depositing a layer of metal on one side of the gate insulation layer away from the semiconductor layer to form the gate metal layer. The materials of the gate metal layer include Mo, Ti, Cu, and alloys, etc. Depositing one or more thin films of SiNx or SiOx on the side of the buffer layer away from the glass substrate to form the interlayer insulation layer.

One embodiment of the present disclosure is also directed to a display device, which comprises a backboard structure. It should be noted that the backboard structure is set to the aforementioned backboard structure 100, which means that the backboard structure has all embodiments of the aforementioned backboard structure 100. The display device also has all technical features of all embodiments of the aforementioned backboard structure 100, and thus has all beneficial effects brought by all technical features, and will not go into such detail again here.

In the above embodiments, the description of each embodiment has its own emphasis, and the part not described in detail in one embodiment may be referred to the relevant description of other embodiments.

The method for manufacturing a backboard structure and the related display panel provided in the above embodiments of the present disclosure provided are introduced in detail, the principle and embodiment of the present disclosure is elaborated in the present disclosure by specific examples. The description of the above embodiments is only used to help understand the technical solution of the present disclosure and its core idea. At the same time, for those skilled in the art, according to the idea of the present disclosure, there will be changes in the specific embodiment and the scope of application, in summary, the content of this specification should not be understood as a restriction on the present disclosure.

What is claimed is:

1. A backboard structure, comprising:

an array substrate;

an auxiliary electrode layer, formed on the array substrate;

a passivation layer, formed on the array substrate and covering the auxiliary electrode layer;

a planarization layer, formed on the side of the passivation layer away from the array substrate, and a hole formed through the passivation layer at a position corresponding to the auxiliary electrode layer;

a padding portion, formed on an inner wall of the hole and covering a portion of the auxiliary electrode layer;

a pixel definition layer, formed on the side of the planarization layer away from the passivation layer, wherein the pixel definition layer comprises an extension section for covering the inner wall of the hole, the extension section forms an overlapping hole and extends towards the padding portion, and a drilling structure is formed at an end of the extension section; and a cathode layer, formed on one side of the pixel definition layer away from the planarization layer, and having a continuous overlap section overlapped with the auxiliary electrode layer through the overlapping hole and the drilling structure.

2. The backboard structure as claimed in claim 1, wherein the inner wall of the hole protrudes towards the middle of the hole at the position corresponding to the passivation layer to form a first annular pad layer, and the first annular pad layer covers a portion of the auxiliary electrode layer; and the padding portion comprises the first annular pad layer.

3. The backboard structure as claimed in claim 2, wherein the inner wall of the hole is ringed with a first anode pad upper layer at a position corresponding to the planarization layer, the first anode pad upper layer is located on the side of the first annular pad layer away from the auxiliary electrode layer, and the first anode pad upper layer has a covering section, which extends to the inner wall of the first annular pad layer;

wherein the padding portion further comprises the first anode pad upper layer; and the continuous overlap section of the cathode layer overlaps with the first anode pad upper layer.

4. The backboard structure as claimed in claim 1, wherein the inner wall of the hole is ringed with a second anode pad upper layer at a position corresponding to the passivation layer, and the second anode pad upper layer covers a portion of the auxiliary electrode layer;

wherein the padding portion comprises the second anode pad upper layer; and the continuous overlap section of the cathode layer overlaps with the second anode pad upper layer.

5. The backboard structure as claimed in claim 1, further comprising an organic functional layer that comprises a first segment and a second segment separated from the first segment, wherein the first segment is formed between the pixel definition layer and the cathode layer, a portion of the first segment extends along the inner wall of the overlapping hole to the drilling structure and envelops the inner wall of the overlapping hole, and the second segment is located within the hole and covers the auxiliary electrode layer.

6. A method for manufacturing a backboard structure, comprising:

providing an array of substrates;

patterning a passivation layer deposited on one side of the array substrate with yellow light and etching processes;

patterning a planarization layer formed on the side of the passivation layer away from the array substrate;

forming holes through the passivation layer at the auxiliary electrode layer corresponding to the array substrate on the planarization layer, and forming a padding portion on the inner wall of the holes;

depositing an anode layer on the side of the planarization layer away from the passivation layer, and defining an anode pattern using yellow light, wherein the anode layer corresponds to the pixel electrode area setting;

forming a pixel definition layer covering the anode layer on the side of the planarization layer away from the passivation layer, wherein an extension section of the pixel definition layer covers the inner wall of the hole to enclose and form an overlapping hole;

exposing and developing the pixel definition layer to form a drilling structure on the inner wall of the overlapping hole and near the padding portion;

forming an organic functional layer on the side of the pixel definition layer away from the planarization layer; and forming a cathode layer on the side of the organic functional layer away from the pixel definition layer, wherein the cathode layer has a continuous overlap section, which is overlapped with the auxiliary electrode layer of the array substrate through the overlapping hole and the drilling structure.

7. The method as claimed in claim 6, wherein the forming holes through the passivation layer at the auxiliary electrode layer corresponding to the array substrate on the planarization layer, and forming a padding portion on the inner wall of the holes, comprises:

forming a first through-hole on the passivation layer, wherein the first through-hole corresponds to the auxiliary electrode layer of the array substrate; and forming a second through-hole at the auxiliary electrode layer corresponding to the array substrate on the planarization layer, wherein the second through-hole is connected to the first through-hole to form the hole, and an aperture of the second through-hole is larger than an aperture of the first through-hole, so that the passivation layer at the edge of the first through-hole forms a first annular pad layer to form the padding portion.

8. The method as claimed in claim 7, wherein after the forming a second through-hole at the auxiliary electrode layer corresponding to the array substrate on the planarization layer, the method further comprises:

depositing a first anode pad upper layer at the auxiliary electrode layer corresponding to the array substrate, and defining a first anode pad upper layer pattern using yellow light, wherein the first anode pad upper layer is located on the side of the first annular pad layer away from the auxiliary electrode layer to jointly form the padding portion, and the first anode pad upper layer has a coverage section to extend to the inner wall of the first annular pad layer.

9. The method as claimed in claim 6, wherein the forming holes through the passivation layer at the auxiliary electrode layer corresponding to the array substrate on the planarization layer, and forming a padding portion on the inner wall of the holes, comprises:

forming holes through the passivation layer at the auxiliary electrode layer corresponding to the array substrate on the planarization layer; and depositing a second anode pad upper layer at the auxiliary electrode layer corresponding to the array substrate, and defining a second anode pad upper layer pattern using yellow light to form the padding portion, wherein the second anode pad upper layer is ringed on the inner wall of the hole and covers a portion of the auxiliary electrode layer.

10. A display device comprising a backboard structure, the backboard structure comprising:

an array substrate;

an auxiliary electrode layer, formed on the array substrate;

a passivation layer, formed on the array substrate and covering the auxiliary electrode layer;

a planarization layer, formed on the side of the passivation layer away from the array substrate, and a hole formed through the passivation layer at a position corresponding to the auxiliary electrode layer;

a padding portion, formed on an inner wall of the hole and covering a portion of the auxiliary electrode layer;

a pixel definition layer, formed on the side of the planarization layer away from the passivation layer, wherein the pixel definition layer comprises an extension section for covering the inner wall of the hole, the extension section forms an overlapping hole and extends towards the padding portion, and a drilling structure is formed at an end of the extension section; and a cathode layer, formed on one side of the pixel definition layer away from the planarization layer, and having a continuous overlap section overlapped with the auxiliary electrode layer through the overlapping hole and the drilling structure.

11. The display device as claimed in claim 10, wherein the inner wall of the hole protrudes towards the middle of the hole at the position corresponding to the passivation layer to form a first annular pad layer, and the first annular pad layer covers a portion of the auxiliary electrode layer; and the padding portion comprises the first annular pad layer.

12. The display device as claimed in claim 11, wherein the inner wall of the hole is ringed with a first anode pad upper layer at a position corresponding to the planarization layer, the first anode pad upper layer is located on the side of the first annular pad layer away from the auxiliary electrode layer, and the first anode pad upper layer has a covering section, which extends to the inner wall of the first annular pad layer;

wherein the padding portion further comprises of the first anode pad upper layer; and the continuous overlap section of the cathode layer overlaps with the first anode pad upper layer.

13. The display device as claimed in claim 10, wherein the inner wall of the hole is ringed with a second anode pad upper layer at a position corresponding to the passivation layer, and the second anode pad upper layer covers a portion of the auxiliary electrode layer;

wherein the padding portion comprises the second anode pad upper layer; and the continuous overlap section of the cathode layer overlaps with of the second anode pad upper layer.

14. The display device as claimed in claim 10, wherein the backboard structure further comprises an organic functional layer comprising a first segment and a second segment separated from the first segment, and wherein the first segment is formed between the pixel definition layer and the cathode layer, a portion of the first segment extends along the inner wall of the overlapping hole to the drilling structure and envelops the inner wall of the overlapping hole, and the segment is located within the hole and covers the auxiliary electrode layer.

* * * * *